United States Patent
Ji et al.

(10) Patent No.: US 9,337,108 B2
(45) Date of Patent: May 10, 2016

(54) SEMICONDUCTOR DEVICE WITH METAL GATE AND HIGH-K DIELECTRIC LAYER, CMOS INTEGRATED CIRCUIT, AND METHOD FOR FABRICATING THE SAME

(75) Inventors: Yun-Hyuck Ji, Gyeonggi-do (KR);
Beom-Yong Kim, Gyeonggi-do (KR);
Seung-Mi Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 614 days.

(21) Appl. No.: 13/339,922

(22) Filed: Dec. 29, 2011

(65) Prior Publication Data
US 2013/0105905 A1    May 2, 2013

(30) Foreign Application Priority Data
Oct. 31, 2011    (KR) .................. 10-2011-0111825

(51) Int. Cl.
*H01L 29/49*     (2006.01)
*H01L 21/8238*   (2006.01)
*H01L 21/28*     (2006.01)
*H01L 21/02*     (2006.01)
*H01L 29/51*     (2006.01)

(52) U.S. Cl.
CPC .. *H01L 21/823807* (2013.01); *H01L 21/02148* (2013.01); *H01L 21/02274* (2013.01); *H01L 21/28202* (2013.01); *H01L 21/823828* (2013.01); *H01L 21/823842* (2013.01); *H01L 29/495* (2013.01); *H01L 29/4966* (2013.01); *H01L 29/518* (2013.01)

(58) Field of Classification Search
CPC .............. H01L 29/495; H01L 29/4966; H01L 21/28202
See application file for complete search history.

(56) References Cited

U.S. PATENT DOCUMENTS

| | | | |
|---|---|---|---|
| 5,245,208 A * | 9/1993 | Eimori .......................... | 257/344 |
| 5,266,510 A * | 11/1993 | Lee ............................... | 438/298 |
| 5,674,788 A * | 10/1997 | Wristers et al. ............... | 438/301 |
| 2007/0210351 A1* | 9/2007 | Tsuchiya et al. ............... | 257/288 |
| 2009/0261424 A1* | 10/2009 | Chang et al. .................. | 257/392 |
| 2012/0038009 A1* | 2/2012 | Toh et al. ....................... | 257/411 |

* cited by examiner

*Primary Examiner* — Matthew Reames
(74) *Attorney, Agent, or Firm* — IP & T Group LLP

(57) ABSTRACT

A semiconductor device includes a gate dielectric layer over a substrate, a metal layer over the gate dielectric layer, a capping layer over the metal layer, wherein the capping layer includes a plurality of dipole forming elements concentrated at the interface between the metal layer and the capping layer.

12 Claims, 9 Drawing Sheets

SEMICONDUCTOR DEVICE WITH METAL GATE AND HIGH-K DIELECTRIC LAYER, CMOS INTEGRATED CIRCUIT, AND METHOD FOR FABRICATING THE SAME

CROSS-REFERENCE TO RELATED APPLICATIONS

The present application claims priority of Korean Patent Application No. 10-2011-0111825, filed on Oct. 31, 2011, which is incorporated herein by reference in its entirety.

BACKGROUND

1. Field

Exemplary embodiments of the present invention relate to a semiconductor device, and more particularly, to a semiconductor device having a metal gate and a high-k dielectric layer, a complementary metal oxide semiconductor (CMOS) integrated circuit, and a method for fabricating the same.

2. Description of the Related Art

A gate stack structure of a semiconductor device such as a metal oxide semiconductor field-effect transistor (MOSFET) includes a gate dielectric layer formed over a substrate and a gate electrode formed over a gate dielectric layer. In general, silicon oxide ($SiO_2$) has been used for the gate dielectric layer, and silicon has been used for the gate electrode.

When the thickness of the silicon oxide is physically reduced, a control power of a gate voltage may be enhanced to increase a drive current. However, such a physical reduction in the thickness of the gate dielectric layer may degrade an off-state characteristic due to an increase of leakage current caused by direct tunneling.

Meanwhile, in order to implement gate electrodes of an N-channel MOSFET (NMOS) and a P-channel MOSFET (PMOS) during a CMOS integrated circuit process, lithography and ion implantation processes are performed after silicon is deposited. That is, $N^+$-doped silicon which is doped with high-concentration N-type impurities and $P^+$-doped silicon which is doped with high-concentration P-type impurities are formed. As such, the $N^+$-doped silicon is formed to optimize the threshold voltage of the NMOS, and the $P^+$-doped silicon is formed to optimize the threshold voltage of the PMOS. However, the doped silicon has a drive current which is reduced by gate depletion. In particular, boron implanted into the $P^+$-doped silicon of the PMOS may be out-diffused through a subsequent thermal process, and the gate depletion of the PMOS may further increase by 10%, compared with the NMOS. Therefore, the doped silicon may have a limit in optimizing the threshold voltage of each MOS.

SUMMARY

An exemplary embodiment of the present invention is directed to a gate stack structure capable of optimizing a threshold voltage and a method for fabricating the same.

Another exemplary embodiment of the present invention is directed to a semiconductor device capable of independently controlling a threshold voltage of an NMOS and a threshold voltage of a PMOS during a CMOS integration process and a method for fabricating the same.

In accordance with an exemplary embodiment of the present invention, a semiconductor device includes a gate dielectric layer over a substrate, a metal layer over the gate dielectric layer, a capping layer over the metal layer, and a plurality of dipole forming chemical element concentrated at the interface between the metal layer and the capping layer, wherein the chemical species form dipoles.

In accordance with another exemplary embodiment of the present invention, the gate dielectric layer, the metal layer, and the capping layer form an NMOS gate stack structure, and the semiconductor device further includes a PMOS gate stack structure isolated from the NMOS gate stack structure and comprising a second gate dielectric layer, a second metal layer, and a second capping layer. In accordance with another exemplary embodiment of the present invention, a semiconductor device includes an N-channel metal oxide semiconductor field-effect transistor (NMOS) gate stack structure and a P-channel metal oxide semiconductor field-effect transistor (PMOS) gate stack structure isolated and formed over a substrate and each including a gate dielectric layer, a metal layer over the gate dielectric layer, and a capping layer over the metal layer a plurality of first chemical species contained in a P-type channel of the substrate under the PMOS gate stack structure and controlling a threshold voltage of the PMOS, and a plurality of second chemical species contained in the interface between the metal layer and the capping layer of the NMOS gate stack structure and controlling a threshold voltage of the NMOS.

In accordance with still another exemplary embodiment of the present invention, a method for fabricating a semiconductor device includes forming an interfacial layer over a substrate; forming a gate dielectric layer over the interfacial layer, forming a metal layer over the gate dielectric layer; and forming a capping layer over the metal layer, wherein a plurality of chemical species are distributed at the interface between the metal layer and the capping layer to form dipoles.

In accordance with still another exemplary embodiment of the present invention, a method for fabricating a semiconductor device includes forming an isolation region in a substrate, the isolation region defining a first region and a second region, forming a plurality of first chemical species under a substrate surface of the second region, forming a gate dielectric layer on the entire surface of the substrate, forming a metal layer over the gate dielectric layer, forming a capping layer over the metal layer of the first region, the capping layer containing a plurality of second chemical species at the interface with the metal layer, and patterning the capping layer, the metal layer, and the gate dielectric layer to form first and second gates in the first region and the second region, respectively.

In accordance with still another exemplary embodiment of the present invention, a method for fabricating a semiconductor layer includes forming an isolation region in a substrate, the isolation region defining a first region and a second region, forming a P-type channel under a substrate surface of the second region, the P-type channel containing germanium, forming a gate dielectric layer over the entire surface of the substrate, forming a first metal layer over the gate dielectric layer, forming a first capping layer over the first metal layer of the first region, wherein arsenic is distributed at the interface between the first metal layer and the first capping layer, forming a second capping layer over the entire surface of the resultant structure including the first capping layer, forming a second metal layer over the second capping layer, and patterning the second metal layer, the second capping layer, the first capping layer, the first metal layer, and the gate dielectric layer, to form a gate of a stacked structure in the first region and the second region.

DETAILED DESCRIPTION

Figure 1:
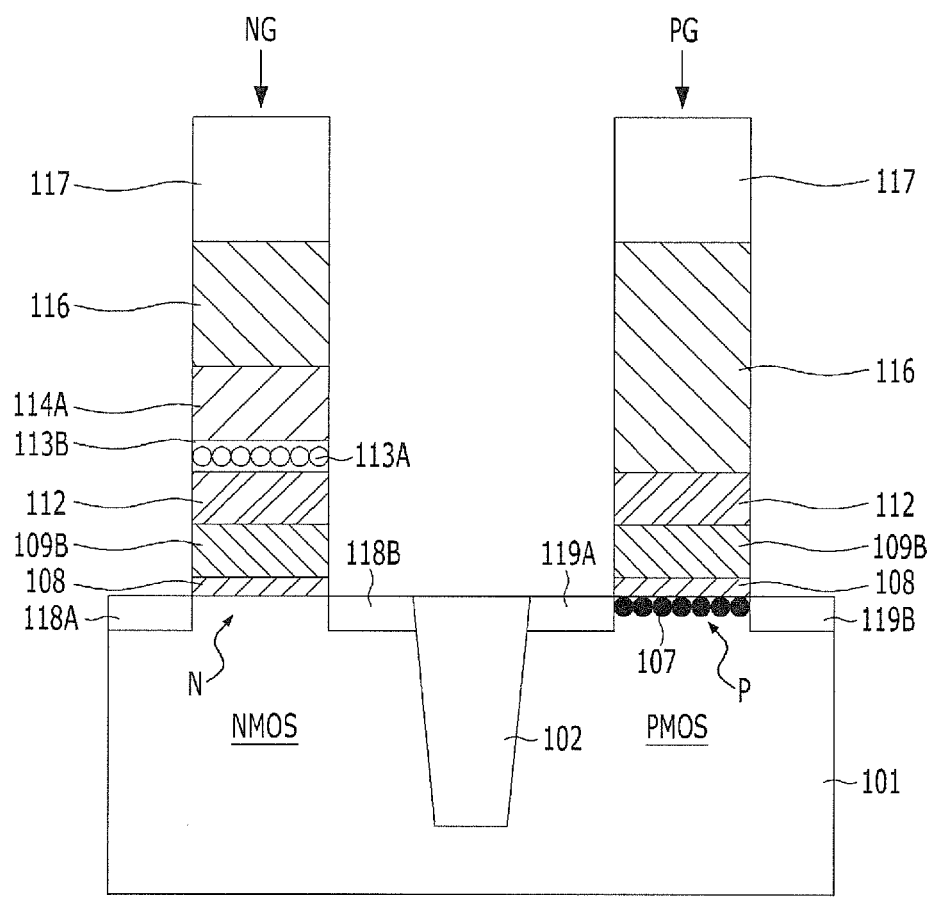
FIG. 1 is a diagram illustrating a gate stack structure in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a diagram illustrating a gate stack structure in accordance with an exemplary embodiment of the present invention. FIG. 1 illustrates a gate stack structure of a CMOS integrated circuit.

Referring FIG. 1, a substrate 101 is divided into a first region NMOS and a second region PMOS, and the first region NMOS and the second region PMOS are isolated by an isolation region 102. The first region NMOS is where an NMOS-FET is formed, and the second region PMOS is where a PMOSFET is formed.

A first gate stack structure NG is formed over the substrate 101 of the first region NMOS, and a second gate stack structure PG is formed over the substrate 101 of the second region PMOS.

The first gate stack structure NG includes a gate dielectric layer 109B, a first metal layer 112, a threshold voltage control layer 113B, a first capping layer 114A, a second capping layer 116, and a second metal layer 117, which are sequentially stacked. The threshold voltage control layer 113B contains a large quantity of arsenic 113A as second chemical species. An N-type channel N is formed in the substrate 101 under the first gate stack structure NG.

The second gate stack structure PG includes a gate dielectric layer 109B, a first metal layer 112, a second capping layer 116, and a second metal layer 117, which are sequentially stacked. A large quantity of germanium 107 is distributed as first chemical species in the substrate 101 under the second gate stack structure PG. Since the second gate stack structure PG is a gate of the PMOS, the germanium 107 is distributed or formed in a P-type channel.

Each of the first and second gate stack structures NG and PG further includes an interfacial layer 108 between the gate dielectric layer 109B and the substrate 101. The interfacial layer 108 may include silicon oxide.

The first and second gate stack structures NG and PG will be described in more detail as follows.

First, the gate dielectric layer 109B includes a high-k dielectric material (hereinafter, referred to as 'high-k dielectric layer'). The high-k dielectric layer has a higher dielectric constant than the dielectric constant (about 3.9) of silicon oxide ($SiO_2$) which is typically used as the gate dielectric layer. Furthermore, the high-k dielectric layer has a considerably larger physical thickness and a smaller equivalent oxide thickness (EOT) than silicon oxide. The gate dielectric layer 109B includes a metal containing material such as metal oxide, metal silicide, or metal silicate nitride. The metal oxide includes oxide containing metal such as hafnium (Hf), aluminum (Al), lanthanum (La), or zirconium (Zr). The metal oxide may include hafnium oxide ($HfO_2$), aluminum oxide ($Al_2O_3$), lanthanum oxide ($LaO_2$), zirconium oxide ($ZrO_2$), or a combination thereof. The metal silicate includes silicate containing metal such as Hf or Zr. The metal silicate may include hafnium silicate (HfSiO), zirconium silicate ($ZrSiO_x$) or a combination thereof. The metal silicate nitride is a material obtained by adding nitrogen to metal silicate. Desirably, the gate dielectric layer 109B may include metal silicate nitride. The metal silicate nitride may include hafnium silicate nitride (HfSiON). When the metal silicate nitride is used to form the gate dielectric layer 109B, the dielectric constant may be increased, and crystallization of the gate dielectric layer 109B may be suppressed during a subsequent thermal process.

The first metal layer 112 has the same structure in the first and second regions NMOS and PMOS. That is, the first metal layers 112 of the NMOS and the PMOS are formed of the same material. The first metal layer 112 includes metal, metal nitride, or metal carbide. For example, tungsten (W), tantalum (Ta), aluminum (Al), ruthenium (Ru), platinum (Pt), titanium nitride (TiN), tantalum nitride (TaN), titanium carbide (TiC), tantalum carbide (TaC), and a mixture thereof may be used. Furthermore, the first metal layer 112 may include multi-layers of the above-described materials. The first metal layer 112 becomes a metal gate of the NMOS and the PMOS.

The second metal layer 117 may include W. The second metal layer 117 may serve to lower gate resistance.

The first capping layer 114A may serve as a reaction prevention layer for preventing a reaction between the first metal layer 112 and the second metal layer 117. Furthermore, the first capping layer 114A may serve to prevent the first metal layer 112 from being oxidized. The first capping layer 114A may be formed only in the first gate stack structure NG. The first capping layer 114A includes a silicon layer, and the silicon layer may include an undoped layer or a doped layer having a dopant doped therein. Here, a dopant such as P or B may be doped. Desirably, the first capping layer 114A is formed as a doped layer, thereby decreasing gate resistance.

The second capping layer 116 may serve as a reaction prevention layer for preventing a reaction between the first metal layer 112 and the second metal layer 117, together with the first capping layer 114A. Furthermore, the second capping layer 116 may serve to prevent the first metal layer 112 from being oxidized. The second capping layer 116 is formed in both of the first and second gates NG and PG. The second capping layer 116 includes a silicon layer, and the silicon layer may include an undoped layer or a doped layer having a dopant doped therein. Here, a dopant such as P or B may be doped. Desirably, the second capping layer 116 may be formed as a doped layer, thereby decreasing gate resistance. The first capping layer 114A and the second capping layer 116 may be formed of the same material and have the same conductive type.

The germanium 107 as the first chemical element is concentrated in the substrate 101 under the second gate stack structure PG. Since the second gate stack structure PG becomes a gate of the PMOS, the germanium 107 may be formed in the P-type channel.

The threshold voltage control layer 113B is formed of a material containing the arsenic 113A as the second chemical element. The threshold voltage control layer 113B may include an arsenic layer formed of the arsenic 113A or an arsenic rich layer doped with a large quantity of arsenic 113A. Furthermore, the threshold voltage layer 113B may include a silicon layer which is heavily doped with the arsenic 113A. The arsenic 113A is chemical species or chemical elements forming a plurality of dipoles distributed or concentrated in the interface between the first metal layer 112 and the first capping layer 114A.

Inside the substrate 101 of the first region NMOS, N-type source and drain 118A and 118B are formed. The N-type channel N is formed between the N-type source and drain 118A and 118B. Inside the substrate 101 of the second region PMOS, P-type source and drain 119A and 119B are formed. The germanium 107 is distributed or concentrated in the P-type channel P between the P-type source and drain 119A and 119B in the second region PMOS.

Referring to FIG. 1, the respective components of the gates on the first and second regions NMOS and PMOS are stacked in different manners from each other. In the first gate stack structure NG becoming the gate of the NMOS, the threshold voltage control layer 113B is formed at the interface between the first metal layer 112 and the first capping layer 114A.

In accordance with the above-described embodiment of the present invention, the threshold voltages of the NMOS and the PMOS may be controlled independently of each other.

Specifically, as a plurality of germanium 107 is contained or concentrated in the P-type channel P, the energy band gap of the P-type channel decreases to thereby reduce the threshold voltage of the PMOS.

Furthermore, when the threshold voltage control layer 113B containing a large quantity of arsenic 113A is positioned at the interface between the first metal layer 112 and the first capping layer 114A, electronic polarization is induced over the first metal layer 112, thereby forming a dipole. Therefore, the threshold voltage of the NMOS is reduced. The arsenic 113A may serve as a plurality of chemical species or elements which form a number of dipoles. On the other hands, the first capping layer 114 may includes the arsenic 113A.

[Method]

FIGS. 2A to 2K are diagrams illustrating a method for fabricating a semiconductor device in accordance with the exemplary embodiment of the present invention. In the exemplary embodiment of the present invention, a method for fabricating a CMOS integrated circuit will be described. However, the method in accordance with the exemplary embodiment of the present invention is not limited to a CMOS integrated circuit, but may be applied to various kinds of semiconductor devices in which an NMOS and a PMOS are formed. Furthermore, the method in accordance with the exemplary embodiment of the present invention may also be applied to each of an NMOS fabrication method and a PMOS fabrication method. An NMOS and a PMOS are formed within a CMOS integrated circuit. The CMOS integrated circuit includes at least one PMOS and NMOS.

Figure 2A:
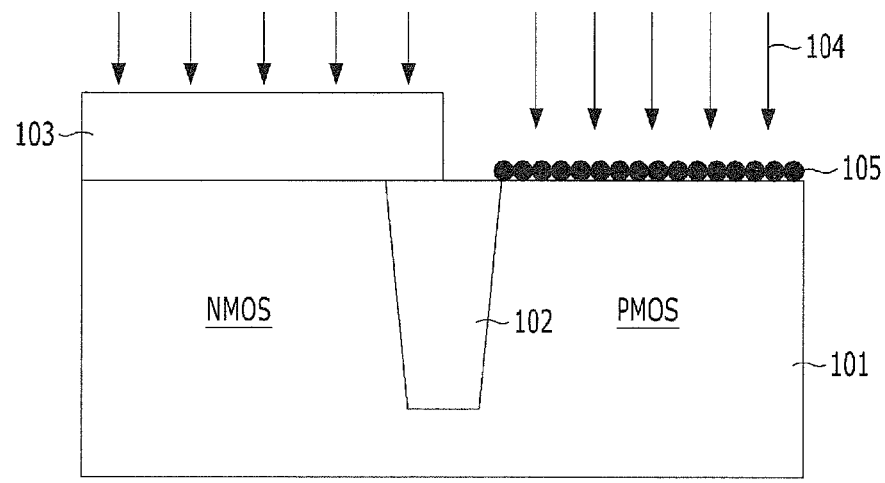
FIGS. 2A to 2K are diagrams illustrating a method for fabricating a semiconductor device in accordance with the exemplary embodiment of the present invention.

Referring to FIG. 2A, a substrate 101 includes a first region NMOS and a second region PMOS. Furthermore, the substrate 101 includes an isolation region 102 for isolating the first and second regions NMOS and PMOS from each other. The isolation region 102 having a trench structure may be formed by a shallow trench isolation (STI). The isolation region 102 may include a dielectric layer (for example, silicon oxide). The NMOS may be formed in the first region NMOS, and the PMOS may be formed in the second region PMOS. The positions of the first and second regions NMOS and PMOS are set for the illustrative purpose, and thus it may be reversed. The substrate 101 may include substrates formed of silicon, germanium, and silicon germanium, and it is not limited thereto. Furthermore, the entire substrate 101 or a part of the substrate 101 may be strained. Furthermore, although not illustrated, the first and second regions NMOS and PMOS may include first and second wells, respectively, which are formed through a well formation process. The first region NMOS may have a first P-type well formed therein, and the second region PMOS may have a second N-type well formed therein. In order to form the second N-type well, N-type impurities such as P or As may be implanted into the second region PMOS of the substrate 101. In order to form the first P-type well, P-type impurities such as B may be implanted into the first region NMOS of the substrate 101. Furthermore, although not illustrated, a channel region may be formed in the first and second regions NMOS and PMOS through a channel ion implantation process, after the well formation process. The first region NMOS may have an N-type channel region formed therein, and the second region NMOS may have a P-type channel region formed therein. In order to form the N-type channel region, N-type impurities such as P or As may be implanted into the first region NMOS of the substrate 101. In order to form the P-type channel region, P-type impurities such as B may be implanted into the second region PMOS of the substrate 101.

A first photoresist layer pattern 103 is formed to cover any one region of the substrate 101. Here, the one region may include any one region of the first and second regions, for example, the first region NMOS. Therefore, the first photoresist layer pattern 103 covers the first region NMOS and selectively exposes the second region PMOS.

Plasma doping 104 is performed on the surface of the substrate 101 of the exposed second region PMOS. The plasma doping 104 is performed by implanting first chemical species. The first chemical species serve to reduce the threshold voltage of the PMOS. The first chemical species include germanium ions ($Ge^+$) 105. For example, the plasma doping 104 is performed using GeH as a reaction gas, and the reaction gas is decomposed into the germanium ions 105 to adsorb onto the surface of the substrate 101.

As the plasma doping 104 is performed, the germanium ions 105 adsorb onto the surface of the substrate 101 of the second region PMOS. Meanwhile, the germanium ions may adsorb onto the surface of the first photoresist layer pattern 103, but do not adsorb onto the substrate of the first region NMOS under the first photoresist layer pattern 103. Since the first photoresist layer pattern 103 is subsequently removed, the first region NMOS is not affected by the germanium ions.

The plasma doping 104 is substantially performed only on the second region PMOS. That is, the plasma doping 104 is a process for independently controlling the threshold voltage of the PMOS. Desirably, the plasma doping 104 may reduce the threshold voltage of the PMOS.

Figure 2B:
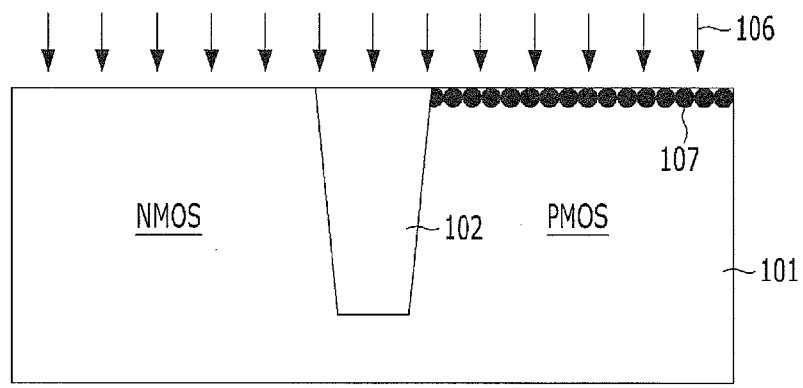

Referring to FIG. 2B, the first photoresist layer pattern 103 is removed, and a cleaning process is performed.

Then, annealing 106 is performed. The annealing 106 is performed at a temperature of 1,000° C. or less under a nitrogen ($N_2$) gas atmosphere. Through the annealing 106, the germanium ions 105 adsorbing onto the surface of the substrate 101 are combined with silicon (Si) of the substrate 101. Therefore, a large amount of germanium 107 is distributed or concentrated under the surface of the substrate 101 of the second region PMOS. The germanium 107 reduces the threshold voltage of the PMOS. Desirably, the germanium 107 is distributed or concentrated in the P-type channel, and the P-type channel region becomes a silicon layer containing a large amount of germanium 107. That is, the P-type channel region becomes a silicon germanium layer (SiGe).

Meanwhile, the plasma doping 104 and the annealing 106 may be performed before the well formation process (or the channel ion implantation process). Furthermore, after the annealing 106 is performed, the first photoresist layer pattern 103 may be removed.

Figure 2C:
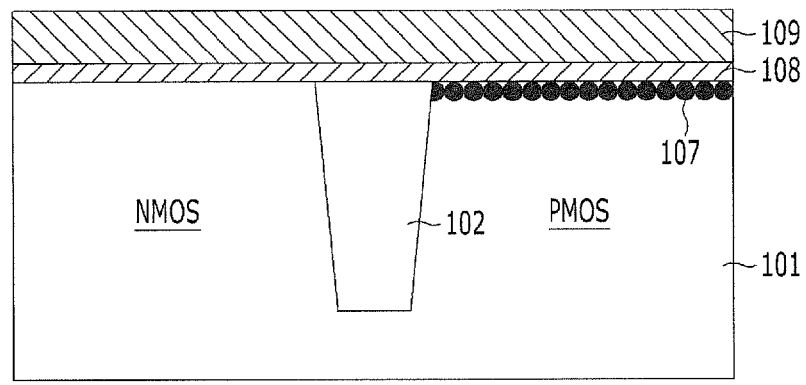
Figure 2D:
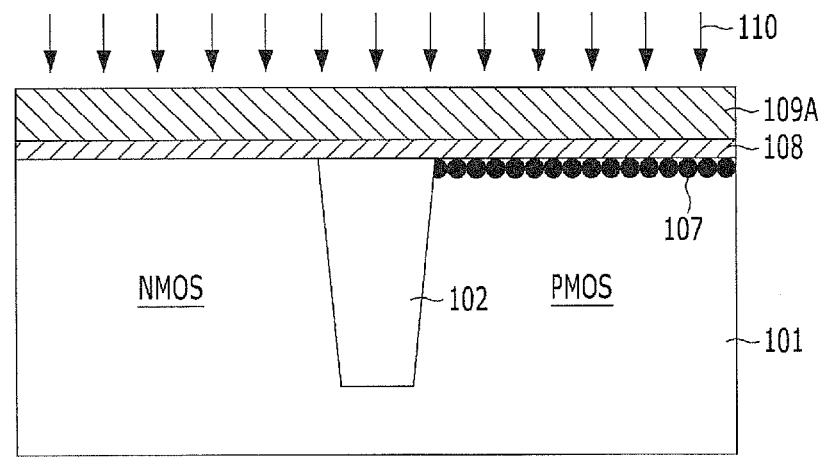
Figure 2E:
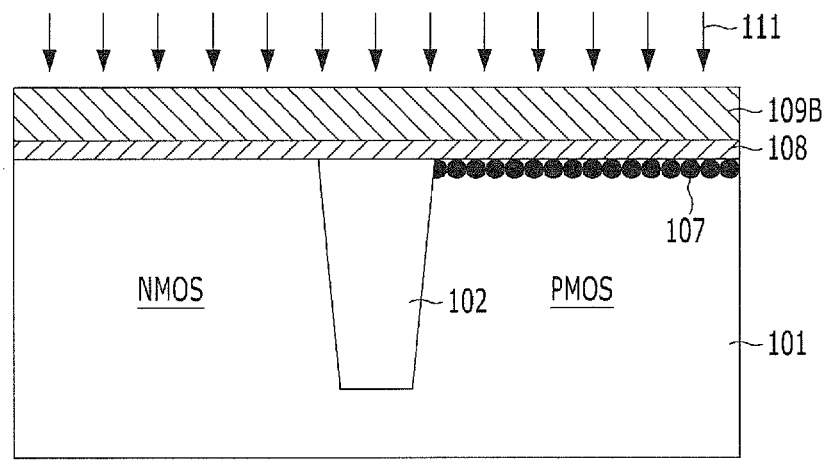

Referring to FIGS. 2C to 2E, a gate dielectric layer 109B is formed over the substrate 101. The gate dielectric layer 109B includes at least a high-k dielectric layer. Furthermore, an interfacial layer 108 may be formed between the substrate 101 and the gate dielectric layer 109B. The gate dielectric layer 109B has the same structure in the first and second regions NMOS and PMOS. That is, the gate dielectric layers 109B of the NMOS and the PMOS are formed of the same material.

The gate dielectric layer 109B is formed by the following method.

First, native oxide on the surface of the substrate 101 is removed through a cleaning process. The cleaning process is performed using a solution containing HF. As the cleaning process is performed, the native oxide on the surface of the substrate 101 is not only removed, but a dangling bond on the surface of the substrate 101 is also passivated with hydrogen. Therefore, the native oxide is suppressed from growing before a subsequent process is performed.

Then, an interfacial layer 108 is formed. The interfacial layer 108 includes a dielectric material, for example, silicon oxide $SiO_2$. The interfacial layer 108 serves to increase interfacial properties between the substrate 101 and a high-k dielectric layer 109, thereby enhancing an electron mobility property. As the interfacial layer 108, silicon oxide may be grown by a wet method using ozone. For example, when the silicon oxide as the interfacial layer 108 is grown by a wet method using ozone and the high-k dielectric layer 109 is formed of a silicate material containing Hf, Hf rich hafnium silicate (HfSiO) is formed during formation of the high-k dielectric layer 109. Accordingly, the dielectric constant of the high-k dielectric layer 109 may be increased. The interfacial layer 108 is grown to have a thickness of 10 Å or less.

Next, the high-k dielectric layer 109 is formed. The high-k dielectric layer 109 includes a material having a high dielectric constant. The high-k dielectric layer 109 has a larger dielectric constant than the dielectric constant (about 3.9) of the silicon oxide ($SiO_2$) which is generally used as a gate dielectric layer. Furthermore, the high-k dielectric layer 109 has a considerably larger physical thickness and a smaller equivalent oxide thickness (EOT) than silicon oxide.

For example, the high-k dielectric layer 109 includes a metal containing material such as metal oxide or metal silicate. The metal oxide includes oxide containing a metal such as Hf, Al, La, or Zr. The metal oxide may include hafnium oxide ($HfO_2$), aluminum oxide ($Al_2O_3$), lanthanum oxide ($LaO_2$), zirconium oxide ($ZrO_2$), or a combination thereof.

The metal silicate includes silicate containing a metal such as Hf or Zr. The metal silicate may include hafnium silicate (HfSiO), zirconium silicate ($ZrSiO_x$), or a combination thereof. In this embodiment of the present invention, hafnium silicate (HfSiO) is used as the high-k dielectric layer 109. As the high-k dielectric layer 109 is formed in both of the NMOS and the PMOS, the process may be simplified. Meanwhile, different high-k dielectric layers may be used as the high-k dielectric layer 109 in the NMOS and the PMOS. The formation process of the high-k dielectric layer 109 may include deposition technology which is suitable for a material to be deposited. For example, the deposition technology may include chemical vapor deposition (CVD), low-pressure CVD (LPCVD), plasma-enhanced CVD (PECVD), metal-organic CVD (MOCVD), atomic layer deposition (ALD), plasma-enhanced ALD (PEALD) and so on. Desirably, the PEALD may be used to form a uniform thin film. For example, the PEALD may be used to form the high-k dielectric layer 109 to have a thickness of 30 Å or less at a temperature of 330° C.

When the high-k dielectric layer 109 is formed of metal silicate, a reaction gas includes a metal source, a silicon source, and an oxygen source. For example, when hafnium silicate (HfSiO) is used, a hafnium source, a silicon source, and an oxygen source may be used as the reaction gas.

As the hafnium source, TEMAH [tetrakis(ethylmethylamino)hafnium, $Hf(N(C_2H_5)CH_3)_4$] is used. As the silicon source, tris-DMASiH [tris(dimethylamino)silane] or tris-EMASiH [tris(ethylmethylamino)silane] is used. As the oxygen source, $O_3$ is used. The hafnium source, the silicon source, and the oxygen source are not limited to the above-described materials.

Referring to FIG. 2D, the high-k dielectric layer 109 is exposed to a nitridation process 110. The nitridation process 110 includes a plasma nitridation process. Accordingly, nitrogen is implanted into the high-k dielectric layer 109. Hereafter, the high-k dielectric layer into which nitrogen is implanted is represented by reference numeral 109A. For example, when the high-k dielectric layer 109 is formed of hafnium silicate (HfSiO), the high-k dielectric layer 109A includes HfSiON through the nitridation process 110. As such, when nitrogen is implanted into the metal silicate, the dielectric constant is increased, and crystallization of the metal silicate may be suppressed during a subsequent thermal process. Desirably, the plasma nitridation process is performed under conditions of a temperature of 600° C. or less, a power of 3 kW or less, and a pressure of 1.0 Torr or less. Furthermore, a mixture of Ar and $N_2$ may be used as the reaction gas.

As the high-k dielectric layer 109 is exposed to nitrogen plasma during the plasma nitridation process, the high-k dielectric layer 109 of the metal silicate becomes the high-k dielectric layer 109A of metal silicate nitride. As a nitrogen supply source for nitrogen plasma, another gas excluding $N_2$ may be used. For example, the nitrogen supply source includes ammonia ($NH_3$) and hydrazine ($N_2H_4$).

Referring to FIG. 2E, the high-k dielectric layer 109A is exposed to an annealing process. Since the annealing process is performed after the nitridation process 110, the annealing process is referred to as post-nitridation annealing (PNA) 111. The hafnium silicate has a nitrogen-rich surface through the plasma nitridation process. When the PNA 111 is performed, nitrogen atoms implanted into the hafnium silicate (HfSiO) may be uniformly diffused in the hafnium silicate (HfSiO). Desirably, the PNA 111 may be performed in a nitrogen gas ($N_2$) atmosphere at a temperature of 950° C. or less and a pressure of 10 Torr or less for 60 seconds.

After the PNA 111 is performed, the high-k dielectric layer is represented by reference numeral 109B, and the high-k dielectric layer 109B becomes a gate dielectric layer. Hereafter, reference numeral 109B represents the gate dielectric layer.

Through the series of above-described processes including the high-k dielectric layer formation process, the nitridation process 110, and the PNA 111, the gate dielectric layer 109B is formed. The gate dielectric layer 109B includes a high-k dielectric layer, or desirably, metal silicate nitride. When the metal silicate nitride is used to form the gate dielectric layer 109B, the dielectric constant may be increased, and crystallization may be suppressed during a subsequent thermal process.

Figure 2F:
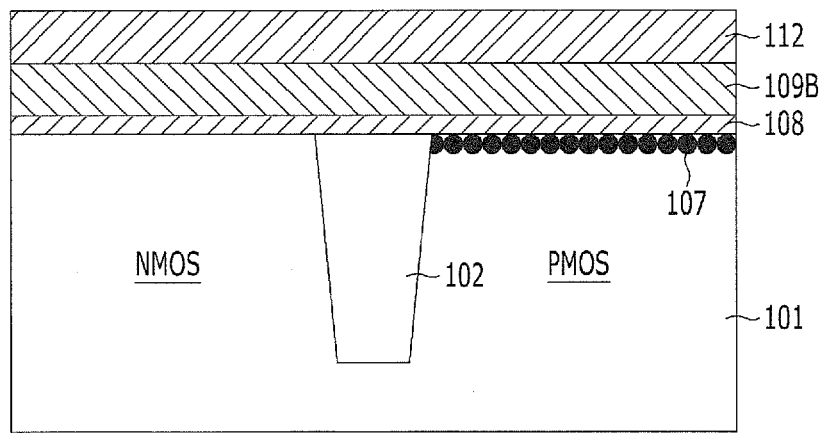

Referring to FIG. 2F, a metal layer 112 is formed over the gate dielectric layer 109B. The metal layer 112 may be formed over the entire surface of the substrate 101 including the gate dielectric layer 109B. The metal layer 112 has the same structure in the first and second regions NMOS and PMOS. That is, the first metal layers 112 of the NMOS and the PMOS are formed of the same material. The first metal layer 112 becomes a metal gate electrode of the NMOS and the PMOS. The first metal layer 112 includes metal, metal nitride, or metal carbide. For example, tungsten (W), tantalum (Ta), aluminum (Al), ruthenium (Ru), platinum (Pt), titanium nitride (TiN), tantalum nitride (TaN), titanium carbide (TiC), tantalum carbide (TaC), and a mixture thereof may be used. Furthermore, the first metal layer 112 may include multi-layers of the above-described materials. In this embodiment of the present invention, the first metal layer 112 is formed of titanium nitride (TiN) and formed to have a thickness of 60A or less at a temperature of 300° C. or less, using PEALD. The PEALD for titanium nitride (TiN) may be performed by repeating a unit cycle several times. The unit cycle may include Ti source implantation, purge, plasma implantation of $N_2$, and purge. The titanium source may include any one selected from TDMAT [tetrakis(dimethylamino) titanium], TEMAT [tetrakis (ethylmethylamino) titanium], and TDETAT [tetrakis (diethylamino) titanium]. As the titanium source, another kind of titanium source may be used. As the nitrogen supply source for nitrogen plasma, another kind of gas excluding nitrogen gas ($N_2$) may be used. For example, the nitrogen supply source includes $NH_3$ and $N_2H_4$.

Figure 2G:
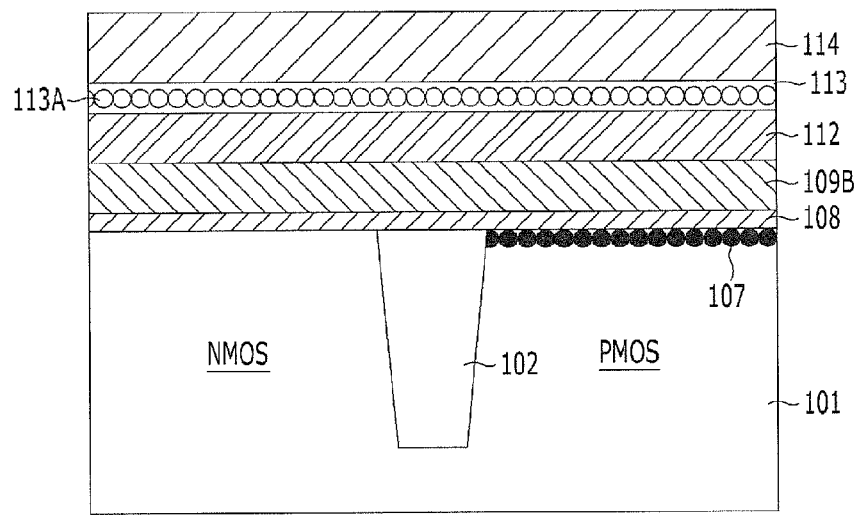

Referring to FIG. 2G, a threshold voltage control layer 113 and a first capping layer 114 are formed over the metal layer 112. The threshold voltage control layer 113 is positioned between the first metal layer 112 and the first capping layer 114. The first capping layer 114 serves to prevent a reaction between the first metal layer 112 and a subsequent low-resistance metal layer and also serves as an oxidation prevention layer for preventing the oxidation of the first metal layer 112.

The threshold voltage control layer 113 contains a large quantity of second chemical species. The second chemical elements reduce the threshold voltage of the NMOS. The second chemical elements include arsenic 113A. The threshold voltage control layer 113 includes an arsenic layer formed of arsenic 113A or an arsenic rich layer doped with a large quantity of arsenic 113A. Furthermore, the threshold voltage control layer 113 may include a silicon layer which is heavily doped with the arsenic 113A. The arsenic 113A contained in the threshold voltage control layer 113 may have a concentration of $10^{19}$ to $10^{22}$ atoms/cm$^3$.

The threshold voltage control layer 113 may become an arsenic layer, and the first capping layer 114 may become a silicon layer. Furthermore, the first capping layer 114 and the threshold voltage control layer 113 may include a silicon layer.

The threshold voltage control layer 113 and the first capping layer 114 may be formed in situ.

First, when the threshold voltage control layer 113 is an arsenic layer and the first capping layer 114 is a silicon layer, an arsenic layer is deposited using $AsH_3$ at the initial stage of silicon layer deposition for the first capping layer 114, and a silicon layer is then deposited to thereby form the first capping layer 114.

Furthermore, when the threshold voltage control layer 113 is a silicon layer which is heavily doped with arsenic and the first capping layer 114 is a silicon layer, a silicon layer is deposited by in-situ doping of arsenic using $AsH_3$ gas at the initial stage of silicon layer deposition for the first capping layer 114, and a silicon layer which is not doped with arsenic is deposited to have a predetermined thickness or more to thereby form the first capping layer 114.

As such, when the threshold voltage control layer 113 is formed, a large quantity of arsenic 113A is distributed at the interface between the first metal layer 112 and the first capping layer 114. That is, the arsenic 113A is piled up at the interface between the first metal layer 112 and the first capping layer 114.

The threshold voltage control layer 113 and the first capping layer 114 may be deposited at a temperature of 550° C. or less and a pressure of 1 Torr or less, using $SiH_4$ as reaction gas. When the threshold voltage control layer 113 is deposited, $AsH_3$ gas is used to dope the threshold voltage control layer 113 with the arsenic 113A. The first capping layer 114 is deposited to have a thickness of 100 Å or less. The threshold voltage control layer 113 may be formed to have a smaller thickness than the first capping layer 114. The first capping layer 114 may include an undoped layer having no dopant doped therein or a doped layer which is doped with another dopant excluding As. Here, a dopant such as P or B may be doped. The arsenic 113A is diffused less than P or B, when exposed to a subsequent thermal process. Desirably, a dopant is doped to decrease the resistance of the gate stack structure. Therefore, the arsenic 113A is not diffused into the first metal layer 112 and the gate dielectric layer 109B, even though the arsenic 113A is exposed to the a subsequent thermal process.

As described above, the threshold voltage control layer 113 containing a large amount of arsenic 113A is formed at the interface between the first capping layer 114 and the first metal layer 112.

Figure 2H:
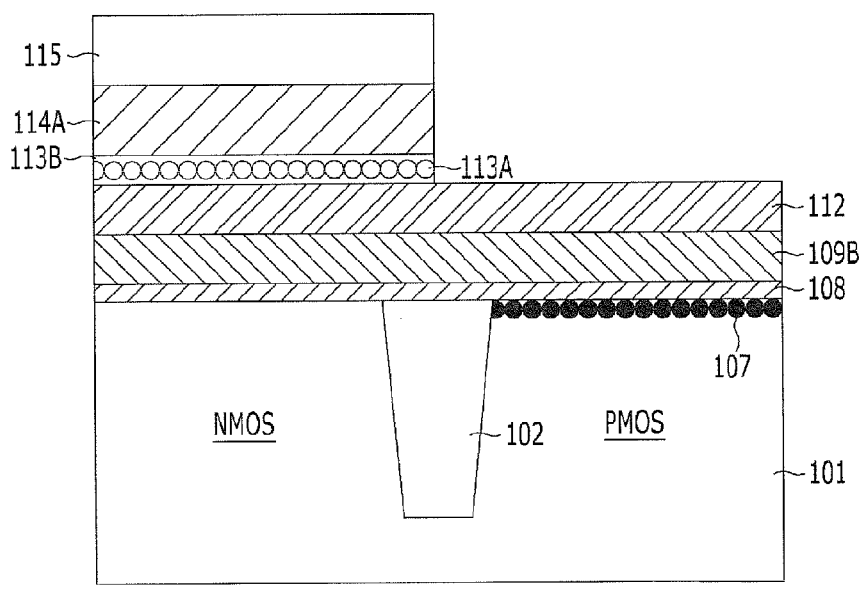

Referring to FIG. 2H, the second photoresist layer pattern 115 is formed through a photolithography process. That is, the second photoresist layer pattern 115 is formed to cover any one region of the substrate 101. Here, the one region indicates any one of the first and second regions, for example, the first region NMOS. Therefore, the second photoresist layer pattern 115 covers the first region NMOS and selectively exposes the second region PMOS.

The exposed first capping layer 114 of the second region PMOS is removed using the second photoresist layer pattern 115 as an etch barrier. At this time, the threshold voltage control layer 113 is removed from the second region PMOS.

Therefore, a first capping layer 114A remains only in the first region NMOS, and a threshold voltage control layer 113B is formed at the interface between the first capping layer 114A and the first metal layer 112. The threshold voltage control layer 113B serves to control the threshold voltage of the NMOS, or particularly, reduce the threshold voltage of the NMOS. The threshold voltage control layer 113B contains a large quantity of arsenic 113A.

According to the above descriptions, the threshold voltage control layer 113B is formed between the first metal layer 112 and the first capping layer 114A in the first region NMOS where the NMOS is formed. In the second region PMOS, the first capping layer 114 and the threshold voltage control layer 113 do not remain over the first metal layer 112.

Figure 2I:
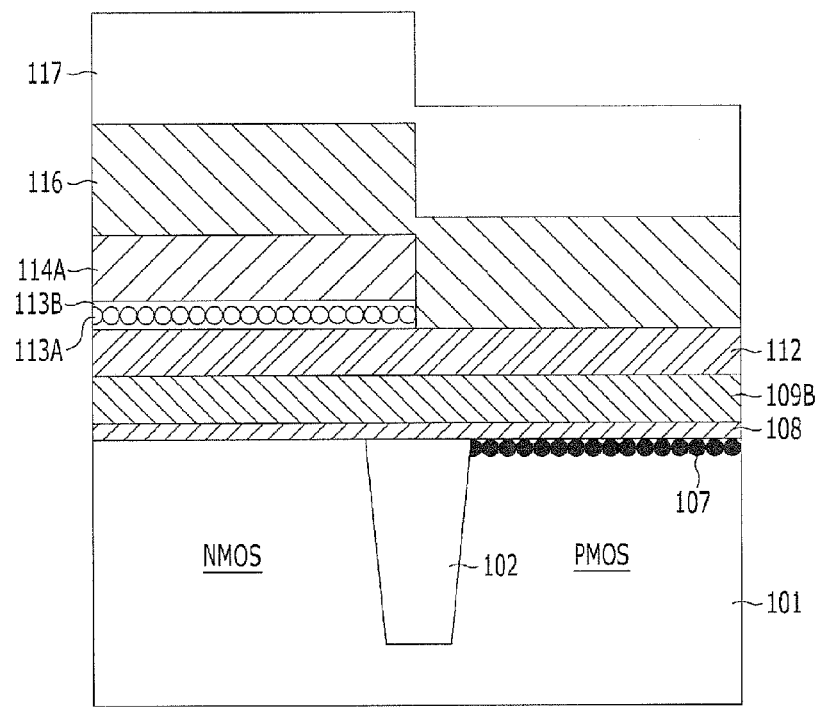

Referring to FIG. 2I, a second capping layer 116 is formed on the entire surface of the substrate 101 including the first capping layer 114A. The second capping layer 116 includes a silicon containing layer. The second capping layer 116 may be deposited regardless of a conductive type. That is, the second capping layer 116 may include an N-type silicon layer or P-type silicon layer. The second capping layer 116 serves to prevent a reaction between the first metal layer 112 and a subsequent low-resistance metal layer, together with the first capping layer 114A. Furthermore, the second capping layer 116 serves as an oxidation prevention layer to prevent the oxidation of the first metal layer 112.

As such, when the second capping layer 116 is formed, a capping layer composed of two layers including the first capping layer 114A and the second capping layer 116 is formed in the first region NMOS, and a single capping layer, that is, the second capping layer 116, is formed in the second region PMOS. As described above, since the first capping layer 114A may include a doped silicon layer, the capping layers formed in the first and second regions NMOS and PMOS may include doped silicon layers. The conductive types of the doped silicon layers may include an N-type or P-type regardless of the NMOS and the PMOS. That is, the first region NMOS may include an N-type silicon layer or P-type silicon layer, and the second region PMOS may include an N-type silicon layer or P-type silicon layer. Furthermore, each of the first and second regions NMOS and PMOS may include only N-type silicon layer or only P-type silicon layer. In short, the capping layers in the first and second regions NMOS and PMOS may be formed of the same material or materials having the same conductive type.

A second metal layer 117 is formed over the second capping layer 116. The second metal layer 117 may include tungsten. The second metal layer 117 serves to reduce the resistance of the gate.

Figure 2J:
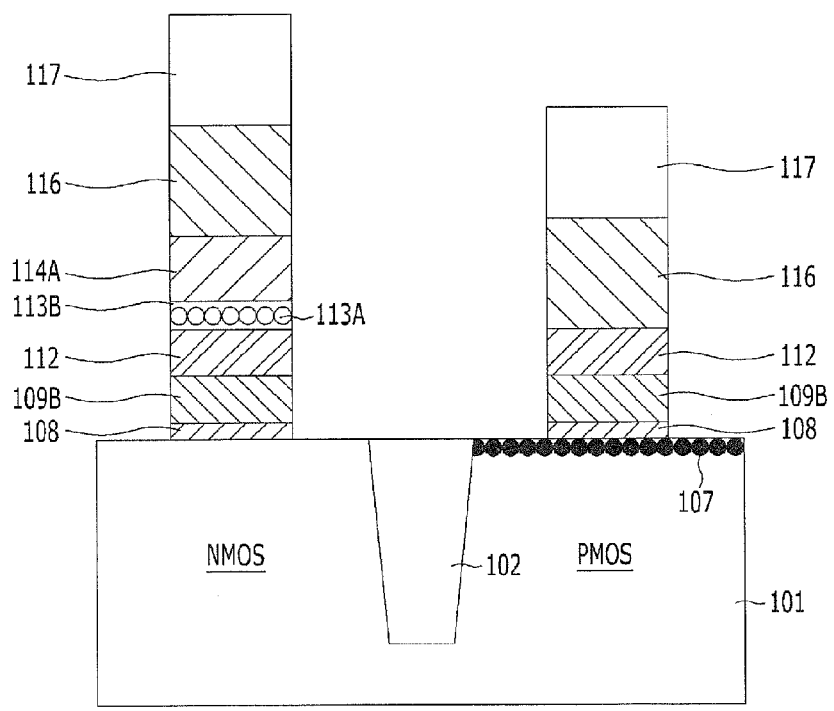

Referring to FIG. 2J, a gate mask (not illustrated) is used to perform a gate patterning process.

Accordingly, the first gate stack structure NG is formed over the substrate 101 of the first region NMOS, and the second gate stack structure PG is formed over the substrate 101 of the second region PMOS. The first gate stack structure NG includes the gate dielectric layer 109B, the first metal layer 112, the threshold voltage control layer 113B, the first capping layer 114A, the second capping layer 116, and the second metal layer 117, which are sequentially stacked. The second gate stack layer PG includes the gate dielectric layer 109B, the first metal layer 112, the second capping layer 116, and the second metal layer 117, which are sequentially stacked. In other words, in the first and second regions NMOS and PMOS, the layers of the respective gate stack structures may be stacked in different manners. Each of the first and second gate stack structures NG and PG further includes an interfacial layer 108 formed under the gate dielectric layer 109B. Furthermore, a large quantity of germanium 107 is contained in the substrate 101 under the second gate stack structure PG, that is, the P-type channel.

Figure 2K:
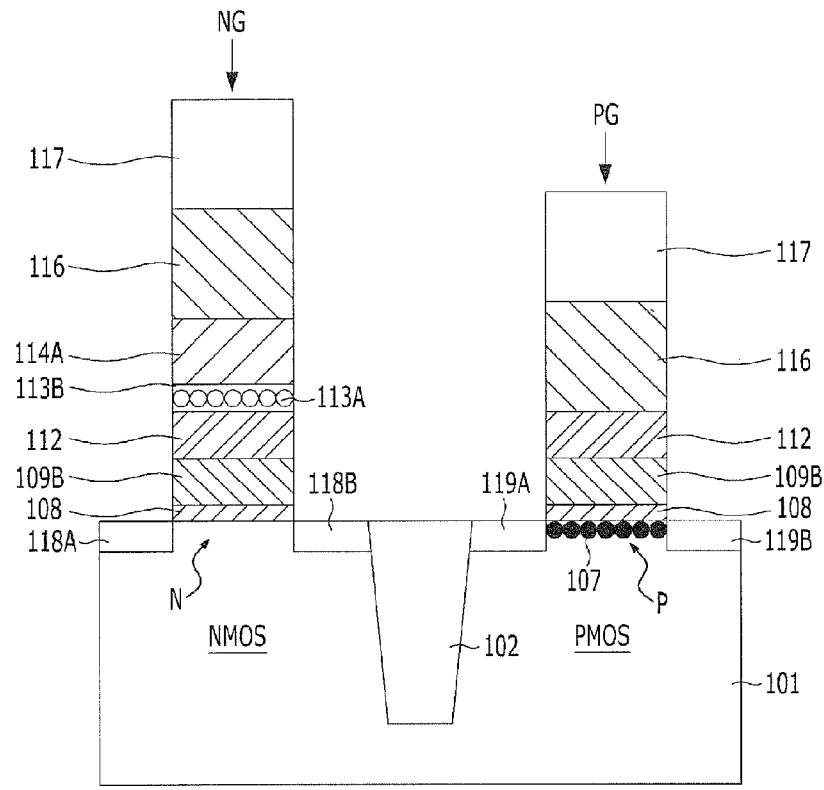

Referring to FIG. 2K, processes known in the art may be performed in the first and second regions NMOS and the PMOS, after the gate patterning process. For example, a source/drain formation process and so on may be performed. The source and drain include N-type source and drain 118A and 118B and P-type source and drain 119A and 119B. The N-type source and drain 118A and 118B are formed in the first region NMOS. Between the N-type source and drain 118A and 118B, the N-type channel N is formed. The P-type source and drain 119A and 119B are formed in the second region PMOS. In the second region PMOS, a large quantity of germanium 107 is contained in the P-type channel P between the P-type source and drain 119A and 119B.

In accordance with the above-described embodiment of the present invention, the first gate stack structure NG becoming the gate of the NMOS includes the threshold voltage control layer 113B formed at the interface between the first metal layer 112 and the first capping layer 114A. That is, the large amount of arsenic 113A is distributed or concentrated at the interface between the first metal layer 112 and the first capping layer 114A. Accordingly, the threshold voltage of the NMOS may be reduced.

Since the PMOS contains a large quantity of germanium 107 in the P-type channel under the second gate stack structure PG, the threshold voltage of the PMOS may be reduced.

In accordance with the embodiment of the present invention, the threshold voltages of the NMOS and the PMOS may be independently controlled during the CMOS integration process.

Specifically, as the germanium 107 is contained in the P-type channel, the energy band gap of the P-type channel decreases to thereby reduce the threshold voltage of the PMOS.

When the threshold voltage control layer 113B containing a large quantity of arsenic 113A is positioned at the interface between the first metal layer 112 and the first capping layer 114A, electronic polarization is induced over the first metal layer 112 to form a dipole. Therefore, the threshold voltage of the NMOS is reduced. The arsenic 113A contained in the threshold voltage control layer 113B become dipole forming species.

Figure 3:
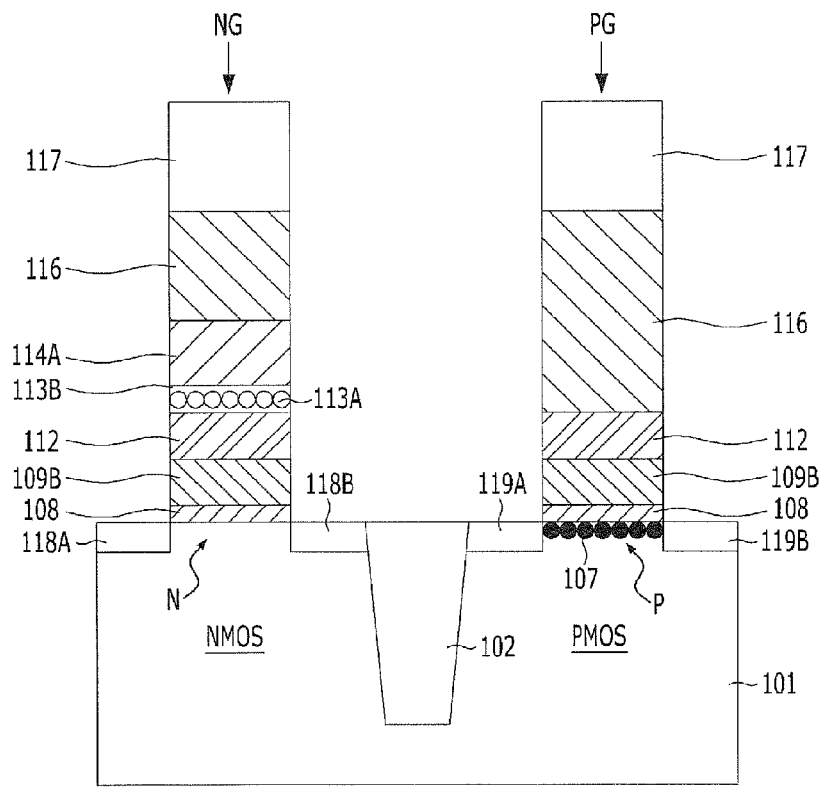
FIG. 3 is a diagram illustrating a modified embodiment of the present invention.

FIG. 3 is a diagram illustrating a modified embodiment of the present invention. In the modified embodiment of the present invention, a planarization process is performed to prevent the occurrence of a stepped portion between the first and second regions NMOS and PMOS during the formation of the second capping layer 116.

Figure 4:
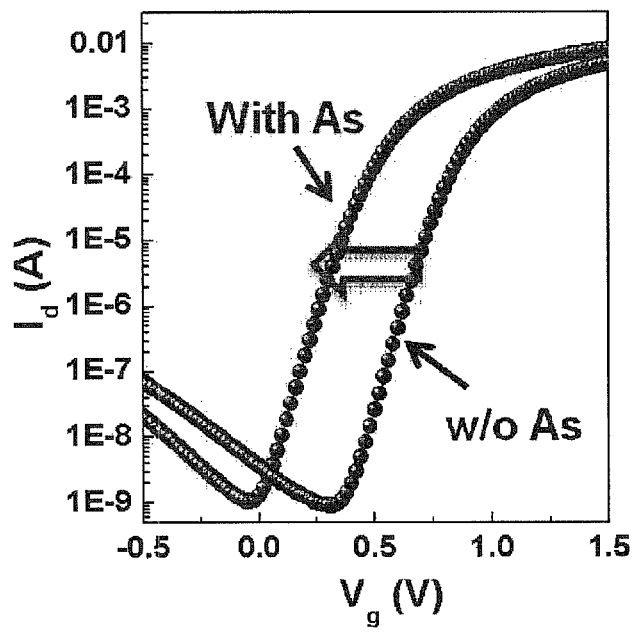
FIG. 4 is a graph illustrates a reduced threshold voltage of the gate stack structure to which arsenic ions are applied in accordance with the exemplary embodiment of the present invention.
Figure 5:
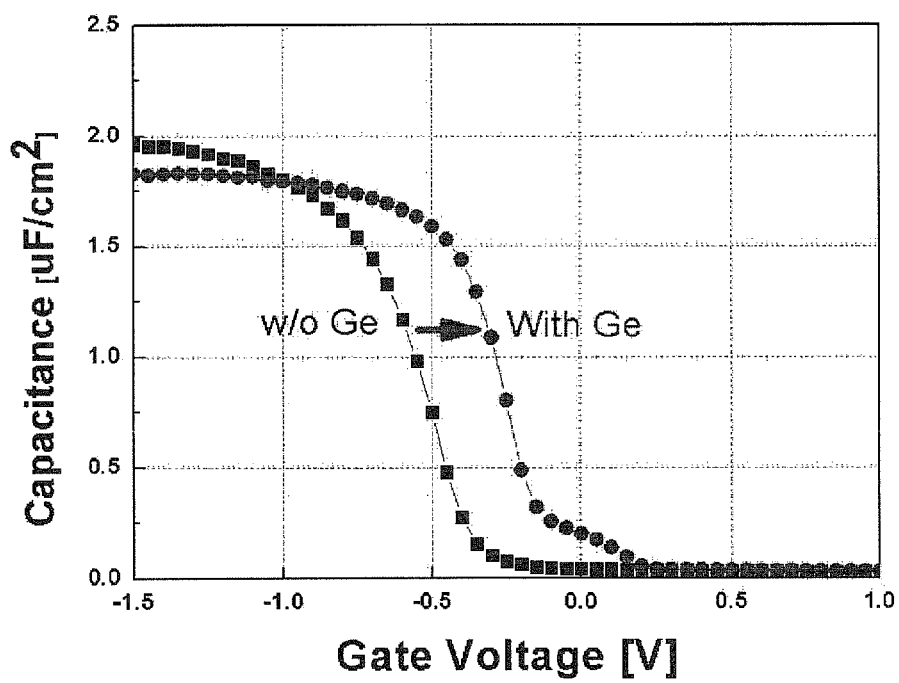
FIG. 5 is a capacitance-voltage curve graph of a PMOS gate stack structure to which germanium ions are applied in accordance with the exemplary embodiment of the present invention.

FIG. 4 illustrates a reduced threshold voltage of the gate stack structure in accordance with another exemplary embodiment of the present invention by comparing a case that arsenic ions are applied and a case that the arsenic ions are not applied. FIG. 5 illustrates curve graphs of PMOS gate stack structures in a case that germanium ions are applied and a case that the germanium ions are not applied.

Referring to FIG. 4, the threshold voltage of NMOS is reduced when the arsenic ions are applied.

Referring to FIG. 5, the curve graph is moved in a positive direction as the threshold voltage of PMOS is reduced by implanting the germanium ions.

Figure 6:
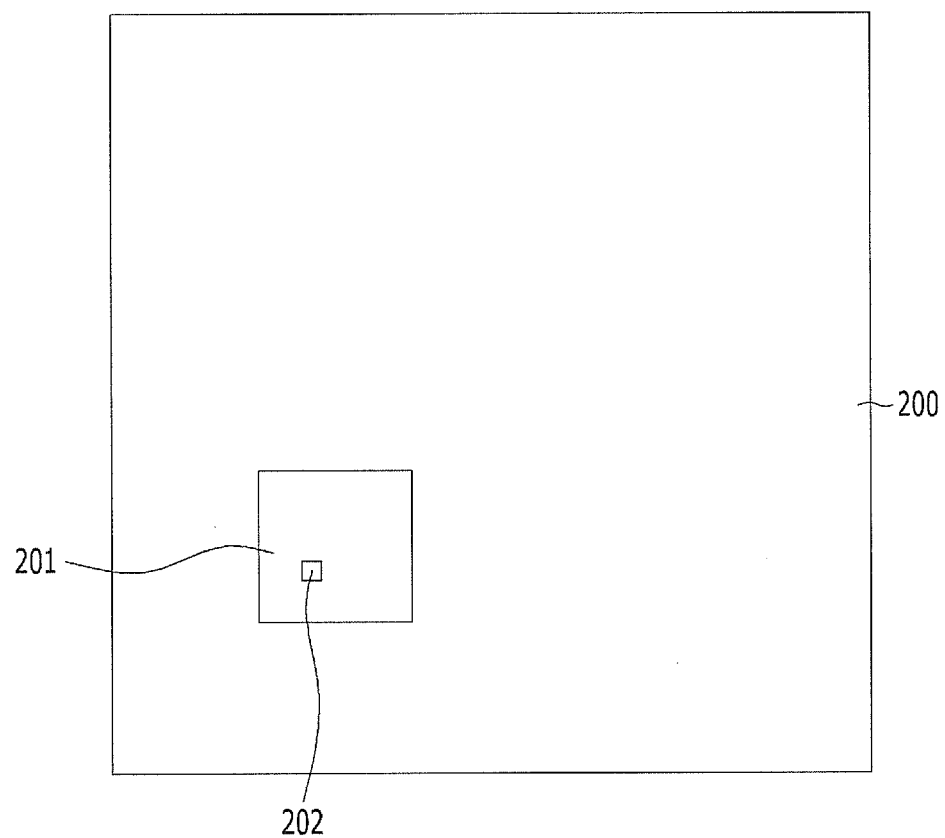
FIG. 6 is a diagram of a processor including one or more CMOS integrated circuits in accordance with another exemplary embodiment of the present invention.

FIG. 6 is a diagram of a processor including one or more CMOS integrated circuits in accordance with another embodiment of the present invention. The processor 200 includes one or more chips 201, each of the chips 201 includes one or more CMOS integrated circuits 202, each of the CMOS integrated circuits 202 includes one or more NMOSs and PMOSs, and each of the NMOSs and the PMOSs includes a gate stack structure having a dielectric layer and a metal layer. The gate of the stacked structure may include the first and second gates in accordance with the embodiment of the present invention.

The semiconductor device in accordance with the embodiment of the present invention may be applied to a dynamic random access memory (DRAM). Without being limited thereto, the semiconductor device may be applied to a static random access memory (SRAM), a flash memory, a ferroelectric random access memory (FeRAM), magnetic random access memory (MRAM), and a phase change random access memory (PRAM).

Main products of the above-described semiconductor device may include a graphic memory having various specifications and a mobile memory which draw attention with the development of mobile communication as well as a computing memory used for a desktop computer, a notebook computer, and a server. Furthermore, the semiconductor device may be provided to not only portable storage media such as memory stick, MMC, SD, CF, xD picture card, and USB flash device, but also various digital applications such as MP3, PMP, digital camera, camcoder, and mobile phone. Furthermore, the semiconductor device may be applied to a multichip package (MCP), a disk on chip (DOC), and an embedded device. Furthermore, the semiconductor device may be applied to a CMOS image sensor (CIS) and provided to various fields such as camera phone, web camera, and medical small-sized imaging device.

In accordance with the embodiments of the present invention, the threshold voltages of the NMOS and the PMOS may be independently controlled during the CMOS integration process. As the germanium is contained in the P-type channel, the energy band gap of the P-type channel decreases to thereby reduce the threshold voltage of the PMOS.

Furthermore, as a large quantity of arsenic is distributed at the interface between the metal layer and the capping layer, electronic polarization is induced over the metal layer to form a dipole. Therefore, the threshold voltage of the NMOS may be reduced in an effective manner.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
    a substrate divided into a first region and a second region;
    a gate dielectric layer over the first region and the second region of the substrate;
    a metal layer over the gate dielectric layer;
    a capping layer over the metal layer;
    a first threshold voltage control layer comprising a plurality of first chemical elements distributed in the substrate of the second region under the gate dielectric layer;
    a second threshold voltage control layer comprising a plurality of dipole forming a plurality of second chemical elements distributed at an interface between the metal layer and the capping layer over the substrate of the first region; and
    a source, a drain, and a channel formed between the source and drain in the substrate of each of the first region and the second region,
    wherein the source, the drain, and the channel of the first region include a N-type source, a N-type drain, and a N-type channel, respectively,
    wherein the source, the drain, and the channel of the second region include a P-type source, a P-type drain, and a P-type channel, respectively,
    wherein the first chemical elements comprise germanium.

2. The semiconductor device of claim 1, wherein the dipole forming chemical elements comprise arsenic (As).

3. The semiconductor device of claim 1, wherein the gate dielectric layer comprises a high-k dielectric layer having a higher dielectric constant than silicon oxide.

4. The semiconductor device of claim 1, further comprising an interfacial layer formed between the gate dielectric layer and the substrate,
    wherein the gate dielectric layer comprises a high-k dielectric layer having a higher dielectric constant than the interfacial layer.

5. The semiconductor device of claim 1, wherein the gate dielectric layer, the metal layer, the second threshold voltage control layer and the capping layer form an NMOS gate stack structure over the substrate of the first region.

6. A semiconductor device comprising:
    an N-channel metal oxide semiconductor field-effect transistor (NMOS) gate stack structure and a P-channel metal oxide semiconductor field-effect transistor (PMOS) gate stack structure isolated and formed over a substrate, each comprising a gate dielectric layer, a metal layer over the gate dielectric layer, and a capping layer over the metal layer;
    a N-type source/drain and a N-type channel formed in the substrate under the NMOS gate stack structure;
    a P-type source/drain and a P-type channel formed in the substrate under the PMOS gate stack structure;
    a plurality of first chemical elements contained in the P-type channel of the substrate under the PMOS gate stack structure and controlling a threshold voltage of the PMOS; and
    a plurality of second chemical elements contained in an interface between the metal layer and the capping layer of the NMOS gate stacked structure and controlling a threshold voltage of the NMOS,
    wherein the first chemical elements comprise germanium.

7. The semiconductor device of claim 6, wherein the second chemical elements comprise arsenic (As).

8. The semiconductor device of claim 6, wherein the capping layer comprises a silicon layer doped with phosphorous (P) or boron (B).

9. The semiconductor device of claim 6, wherein, the gate dielectric layer comprises a high-k dielectric layer having a larger dielectric constant than silicon oxide.

10. The semiconductor device of claim 6, wherein the NMOS gate stack structure and the PMOS gate stack structure further comprise an interfacial layer formed between the gate dielectric layer and the substrate, and
    the gate dielectric layer comprises a high-k dielectric layer having a larger dielectric constant than the interfacial layer.

11. The semiconductor device of claim 6, wherein the P-type channel comprises a silicon layer containing germanium as the first chemical elements.

12. The semiconductor device of claim 1, wherein the first threshold voltage control layer, the gate dielectric layer, the metal layer, and the capping layer form a PMOS gate stack structure in the second region.

* * * * *